United States Patent [19]

Kling et al.

[11] Patent Number: 4,652,842
[45] Date of Patent: Mar. 24, 1987

[54] STAMPED AND FORMED FILTER PIN TERMINAL HAVING AN APERTURE FOR PREVENTING SOLDER WICKING

[75] Inventors: John P. Kling, Mt. Joy; James L. Schroeder, III, Palmyra, both of Pa.

[73] Assignee: AMP Incorporated, Harrisburg, Pa.

[21] Appl. No.: 734,017

[22] Filed: May 14, 1985

Related U.S. Application Data

[63] Continuation of Ser. No. 477,201, Mar. 21, 1983, abandoned.

[51] Int. Cl.⁴ .................. H01R 13/625; H03H 1/00
[52] U.S. Cl. .................. 333/182; 339/275 T; 339/147 P
[58] Field of Search .......... 333/182, 185; 361/302; 339/147 P, 147 R, 143 R, 275 R, 275 B, 275 T, 278 T, 17 R, 17 LC

[56] References Cited

U.S. PATENT DOCUMENTS

| Re. 29,258 | 6/1977 | Fritz | 333/182 |
|---|---|---|---|
| 2,691,771 | 10/1954 | Burtt et al. | 339/275 T X |
| 2,711,524 | 6/1955 | Beaver | 339/275 T X |
| 3,031,635 | 4/1962 | Gluck | 339/275 B X |
| 3,121,602 | 2/1964 | Tuchel | 339/275 T |
| 3,428,934 | 2/1969 | Reider Jr. et al. | 339/275 R X |
| 3,573,707 | 4/1971 | Reynolds | 339/275 B X |
| 3,597,711 | 8/1971 | Buckley | 361/302 X |
| 3,764,943 | 10/1973 | Fort | 333/182 |
| 3,789,263 | 1/1974 | Fritz et al. | 315/39.51 |
| 3,961,294 | 6/1976 | Hollyday | 333/182 |
| 4,017,142 | 4/1977 | Clark et al. | 339/17 R X |
| 4,020,430 | 4/1977 | Vander Heyden | 333/182 |
| 4,053,199 | 10/1977 | Hollyday et al. | 339/147 R |
| 4,265,506 | 5/1981 | Hollyday | 339/147 R |
| 4,296,390 | 10/1981 | Vander Heyden | 333/182 |

Primary Examiner—Eugene R. LaRoche
Assistant Examiner—Benny Lee
Attorney, Agent, or Firm—Katherine A. Nelson

[57] ABSTRACT

A stamped and formed terminal is disclosed as a replacement for the previously used screw machine terminals. The subject terminal is cheaper and easier to produce. It provides an aperture to prevent undesired wicking of solder into the terminal during soldering of the filter sleeve to the terminal and a shoulder to provide correct positioning of the filter sleeve on the terminal.

4 Claims, 2 Drawing Figures

STAMPED AND FORMED FILTER PIN TERMINAL HAVING AN APERTURE FOR PREVENTING SOLDER WICKING

This is a continuation, of application Ser. No. 477,201, filed March 21, 1983, now abandoned.

The present invention relates to a filter pin terminal and in particular to a terminal which is stamped and formed.

Heretofore, the practice of making filtered pin terminals has relied on the use of a screw machine formed terminal. Such a terminal can have a number of drawbacks, among which are the expense of forming such terminal. Examples of such a screw machine form filter terminal pins may be found in U.S. Pat. No. 3,789,263; No. 3,961,294; and No. 4,053,199.

The present invention overcomes the disadvantages of the prior art by producing an improved filter pin terminal in which the pin terminal is stamped and formed. The pin is an elongated conductive member having a first mating portion, an integral intermediate filter bearing portion joined to the mating portion by a sharp shoulder, and a mating tail portion extending from the intermediate portion and separated therefrom by an aperture. The shoulder serves to correctly position a filter sleeve on the terminal and the aperture serves as a stop to prevent solder wicking when the filter sleeve is soldered to the terminal.

An embodiment of the present invention will be described by way of example with reference to the accompanying drawings in which.

Figure 1:
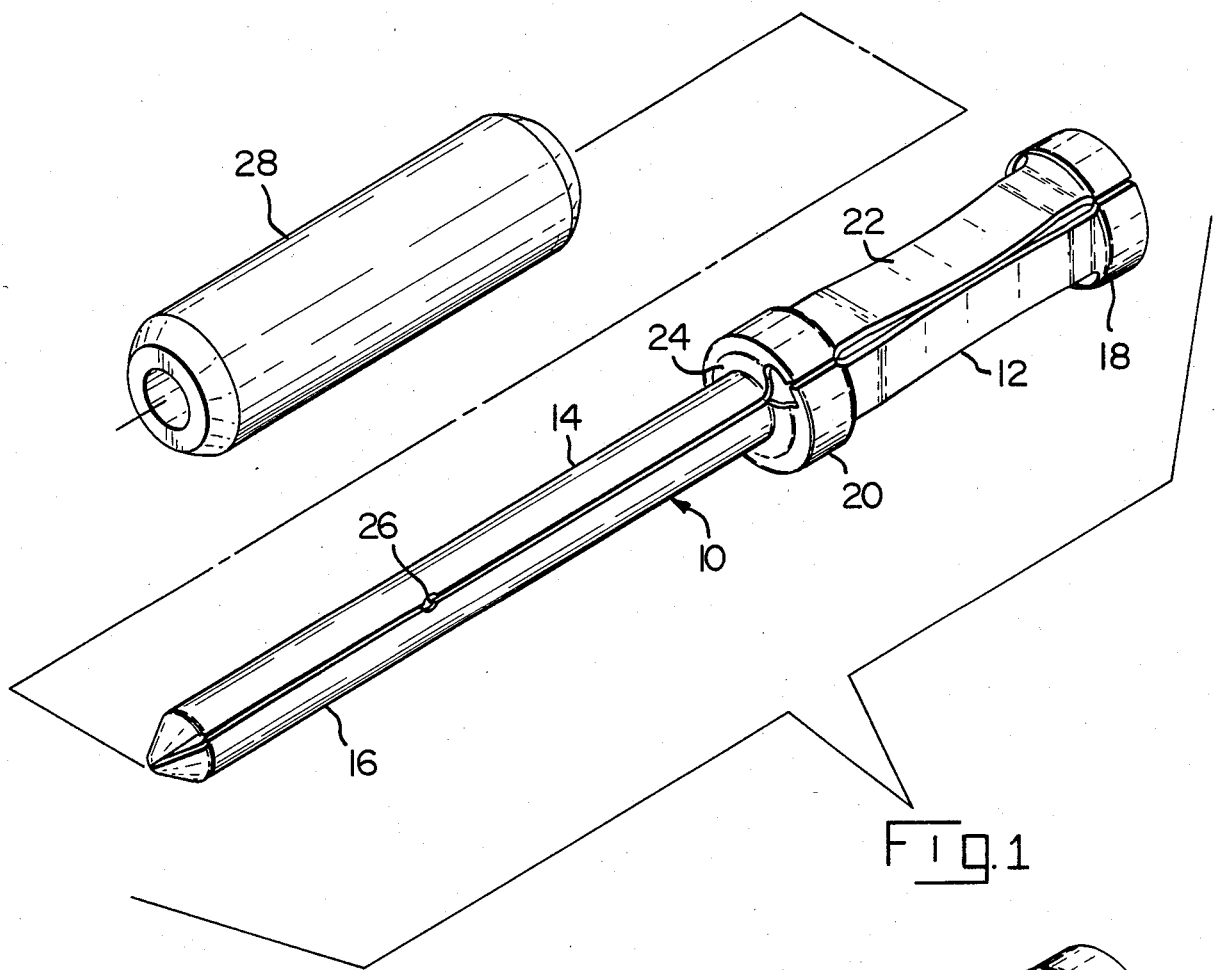
FIG. 1 is a perspective view of the subject invention with a filter sleeve exploded therefrom.

The subject filter terminal pin 10 is a stamped and formed member having a mating portion 12, an intermediate filter mounting portion 14, and a mounting tail 16 portion. The mating portion 12 can have any configuration and has been shown here with a receptacle configuration formed by two end portions 18, 20 which are interconnected by a number, preferably two or four, of semi-elliptic spring beams 22. It should be noted that these spring beams 22 can also be inwardly tapered towards their center portions so as to vary insertion and extraction forces. The end portion 18 may be flared to facilitate entry of a pin therein while the end portion 20 is formed by a sharp rearwardly directed shoulder 24. The length of the intermediate portion 14 is determined between the shoulder 24 and an aperture 26. This length should be in excess of the length of the filter sleeve 28. The filter sleeve is preferably of the type disclosed in U.S. Pat. No. Re. 29,258, the disclosure of which is incorporated herein by reference.

Figure 2:
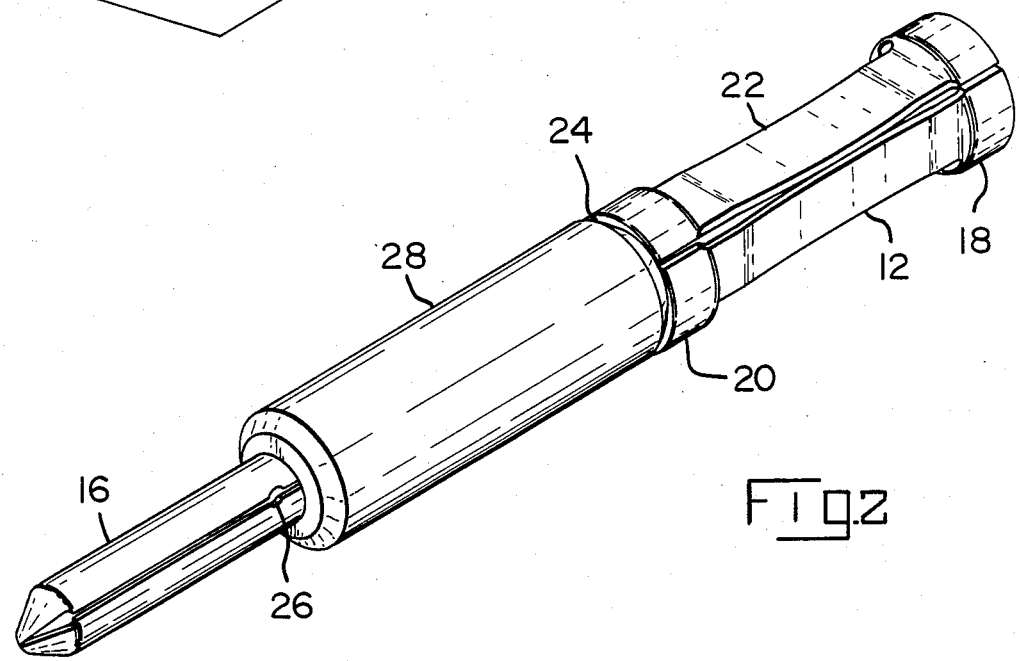
FIG. 2 is a perspective view of the filter pin of the present invention with a filter sleeve secured thereon.

The present invention is utilized much in the same manner as the previous screw machine terminals in that the filter sleeve 28 is simply passed over the mounting end portion 16, to lie over filter mounting portion 14 with one end abutting against the shoulder 24. The filter sleeve 28 is then secured to the terminal pin by a soldering operation. In this operation the aperture 26 serves to prevent wicking of the solder into the terminal. The size of aperture 26 is substantially less than the diameter of the intermediate portion 14 and the mating tail portion 16 as is shown in FIGS. 1 and 2. The thus formed solder terminal pin would then be mounted in a ground plane (not shown) in any of the known fashions, such as those shown in U.S. Pat. No. 4,020,430; No. 4,265,506; and No. 4,296,390, the disclosures of which are incorporated herein by reference.

We claim:

1. A stamped and formed pin terminal for receiving a filter sleeve thereon in soldered engagement therewith, said terminal comprising an elongated conductive member having a first mating end portion, an integral intermediate filter bearing portion connected to said mating end portion by a sharply defined shoulder, and an integral mounting tail portion formed as an integral extension of said filter bearing portion and separated therefrom by at least one aperture, said filter bearing and mounting tail portions having a transverse dimension selected to receive said filter sleeve, said aperture having a size that is relatively smaller than the transverse dimension of said filter bearing and mounting tail portions whereby the filter sleeve is correctly positionable on said filter bearing portion by abutting one end thereof against said shoulder and upon being soldered to said filter bearing portion, said aperture prevents wicking of solder into said terminal.

2. A stamped and formed pin terminal as set forth in claim 1 wherein said mating end portion is a receptacle for receiving a mating electrical conducting member.

3. A filtered terminal comprised of a pin terminal and a filter sleeve member, said terminal comprising an elongated metal member having a first mating end portion, an integral intermediate filter bearing portion connected to said end mating portion by a sharply defined shoulder, and an integral mounting tail portion formed as an integral extension of said filter bearing portion and defined by at least one aperture in the wall of the terminal, the filtered terminal being characterized in that:

said terminal is stamped and formed of sheet metal stock, said filter sleeve member is mounted on said filter bearing portion of said terminal, positioned thereon by said shoulder and soldered thereto, said mounting tail portion is separated from said filter bearing portion by said at least one aperture, said at least one aperture being positioned on said mounting tail portion proximate to the end of said filter member opposite said shoulder, said at least one aperture having a transverse dimension that is smaller than the transverse dimension of said mounting tail portion, whereby said at least one aperture prevents wicking of solder into said terminal.

4. A filtered terminal as set forth in claim 3 wherein said mating end portion is a receptacle for receiving a mating electrical conducting member.

* * * * *

UNITED STATES PATENT AND TRADEMARK OFFICE
CERTIFICATE OF CORRECTION

PATENT NO. : 4,652,842

DATED : March 24, 1987

INVENTOR(S) : Roger W. Durbin et al.

It is certified that error appears in the above-identified patent and that said Letters Patent is hereby corrected as shown below:

On the Title Page, Item [19] "Kling et al." should read
-- Durbin et al.

On the Title Page, Item [Item 75] should read:
-- Roger W. Durbin, Lancaster; John P. Kling, Mt. Joy;
  James L. Schroeder, III, Palmyra, all of Pa. --

Signed and Sealed this

Twentieth Day of October, 1987

Attest:

DONALD J. QUIGG

Attesting Officer

Commissioner of Patents and Trademarks